Aug. 28, 1962 J. O. ESSELSTYN 3,050,841

CIRCUIT BOARD LIFTER TOOLS

Filed Nov. 2, 1959 3 Sheets-Sheet 1

INVENTOR.
J. O. ESSELSTYN
BY F. L. Sullivan
ATTORNEY

INVENTOR.
J.O. ESSELSTYN
BY F. L. Sullivan
ATTORNEY

Aug. 28, 1962 J. O. ESSELSTYN 3,050,841

CIRCUIT BOARD LIFTER TOOLS

Filed Nov. 2, 1959 3 Sheets-Sheet 3

INVENTOR.
J.O. ESSELSTYN
BY
F. J. Sullivan
ATTORNEY 3,050,841

CIRCUIT BOARD LIFTER TOOLS

James O. Esselstyn, Waltham, Mass., assignor to Sylvania Electric Products Inc., a corporation of Delaware Filed Nov. 2, 1959, Ser. No. 850,192
1 Claim. (Cl. 29—268)

This invention is concerned with circuit board lifter tools, particularly a type of tool useful for disengaging circuit element cards from supporting boards.

Some types of modular electronic circuitry utilize the combination of circuit element cards, containing the circuits which are the individual building blocks of a complex system, and etched conductor boards which provide the mechanical and electrical support for a number of element cards snap-fastened to them. Because these boards control the various combinations in which the component circuits of the system are interconnected, they are sometimes called logic boards.

Before the invention of this plug-in board lifter tool, element cards were removed by hand or pried from their supporting board with some kind of lever. These methods were damaging to the cards and the boards. When the cards were removed by hand, they had to be tipped from side to side until the mating contacts were free of each other. This bent the contacts and on frequent occasions made it difficult to afterward mate them with another card. When the cards were pried loose with a lever, the operator risked damaging both the cards and the boards; and, on occasion, a slipping of the lever or metal-to-metal contact short circuited the active elements. It is frequently necessary to remove the cards at various stages of the construction, testing, and operation of the equipment in which they are used. Therefore, it is important to have an efficient, non-destructive lifter tool for the purpose.

Accordingly, a primary object of the present invention is to provide an improved means for removing circuit element cards from mating receptacles on a supporting board without damage to the cards, contacts, or boards. Another object is to provide a means for the maintenance of control over the element cards after separation from a board has been accomplished. A more specific object is to provide an improved lifter tool for removing circuit element cards from supporting boards.

These and related objects are accomplished in one embodiment of the invention, which will be described as featuring a tool comparable in size and basic operation to a pair of pliers. This tool comprises feet with nylon-padded contact areas for bracing against logic boards, clamping jaws adapted to grip the sides of element cards mounted on the boards, and a leverage system, operated by hand grips, which when squeezed closes the jaws against the card in a first operation and then provides a downward restrained thrust against the padded feet with a resultant upward motion of the clamping jaws in a second operation to separate the clamped card from the board.

Other objects and features of the invention will be apparent from the following more detailed description of this illustrative embodiment and reference to the accompanying figures, wherein.

Figure 1:
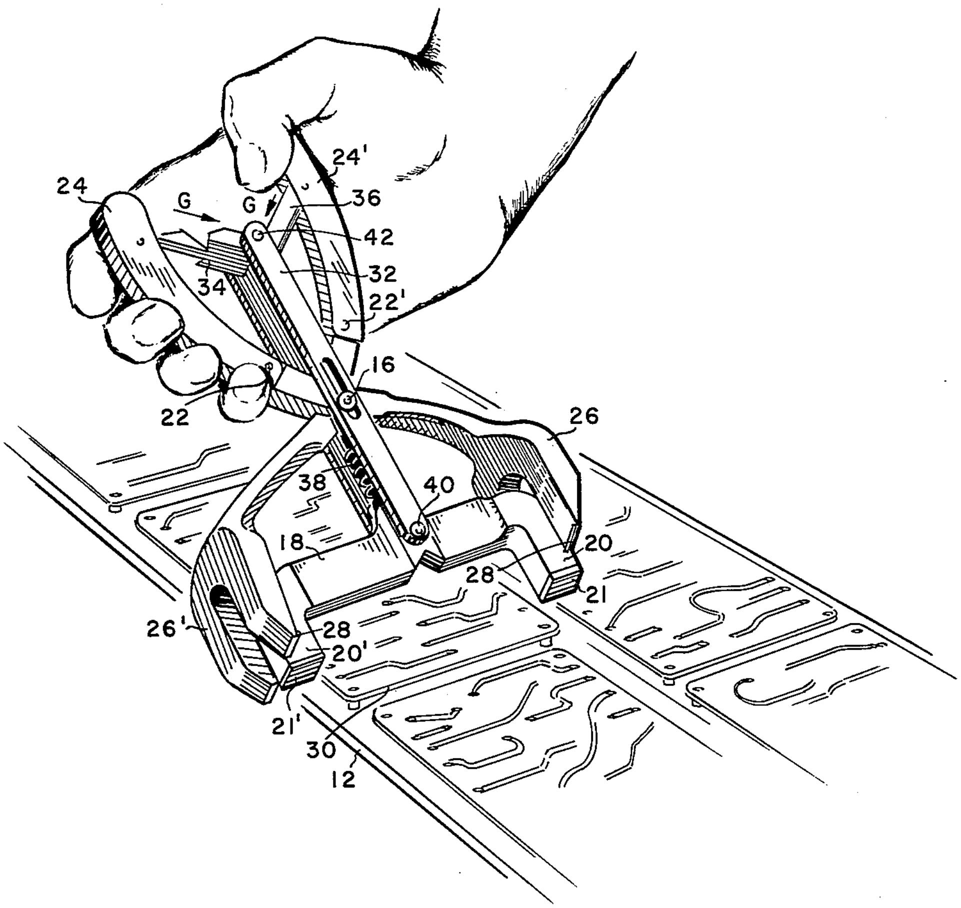
FIG. 1 is an assembled representation of the tool and its action and grip on a typical element card and logic board combination.

In FIG. 1 the tool is shown in full assembly resting on a logic board 12. It comprises two major portions: a clamping assembly consisting of two cross lever members 14, 14′ connected in a scissors arrangement by a common pivot 16 and a pusher assembly comprised principally of a pedestal member 18 having two supporting portions or feet 20, 20′ equipped with protective nylon pads 21, 21′ to avoid physical damage to the portions of the board 12 with which they come into contact and to prevent electrical short circuits.

The cross levers 14, 14′ are divided by pivoted joints 22, 22′ into handle portions 24, 24′ and clamping portions 26, 26′. The lower extremity of these clamping portions are each provided with projecting lips 28, 28′ which are adapted to engage the edges of an element card 30.

The pedestal 18 of the pusher assembly is linked to the handles 24, 24′ by a guidebar 32 and male and female rocker arms 34 and 36, respectively. Arm 36 is cut away in portion so that arm 34 may mate into it when the handles 24, 24′ are closed against each other. A slot 36 in the guidebar 32 is arranged to provide a slideable mount for the dowel type pivot 16, and a tension spring 38 is connected between the dowel 16 and the pedestal 18 to provide a damping effect upon their relative motion.

Figure 2:
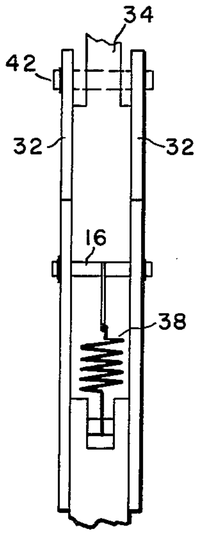
FIG. 2 shows in section view the interaction of dowel, spring, and guidebar in the tool of FIG. 1.
Figure 3:
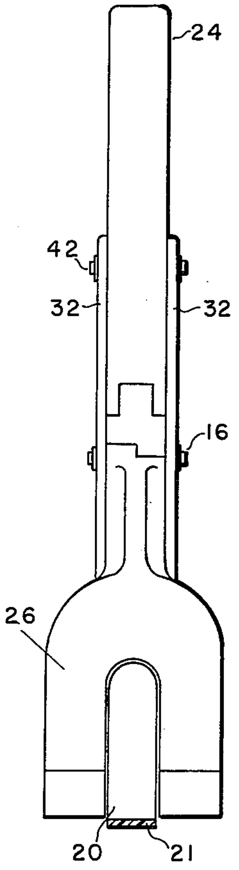
FIG. 3 is a side view of the lifting tool of FIG. 1.

As shown in the side view of FIG. 2 the clamping jaws 26, 26′ are bifurcated so that the feet 20, 20′ are central of the jaws and the upward thrust from the feet is distributed equally instead of being on one side of the card. Similarly, the guidebar 32 is comprised of two similar parts on either side of the assembly which are held together by the dowel 16 and studs 40 and 42.

Briefly, the tool operates in the following manner. When the grips or handles 24, 24′ are moved toward each other by hand pressure, the cross levers 14 and 14′ which are pivoted on the sliding fulcrum 16, close clamps 26, 26′ in a lateral motion toward the element card 30 until the lips 28, 28′ of the clamping jaws are in solid contact with the edges of the card.

When the jaws 26, 26′ have thus been brought into firm clamping position, further lateral motion is prevented by the card itself. This causes the knees 22 and 22′ in the levers 14 and 14′ to bend in response to further applied force and the rockers 34 and 36 to impart a downward force against the guidebar 32 with a consequent thrust of the feet 20 and 20′ against the board 12. The reaction to this thrust is an upward motion of the clamp assembly away from the pedestal assembly and a consequent separation of the card 30 from the board 12. Once the element card is thus separated from the board in the manner described, it may be held between the jaws 26, 26′ by simply retaining hand pressure on the grips 24, 24′ until the card can be safely released.

Figure 5:
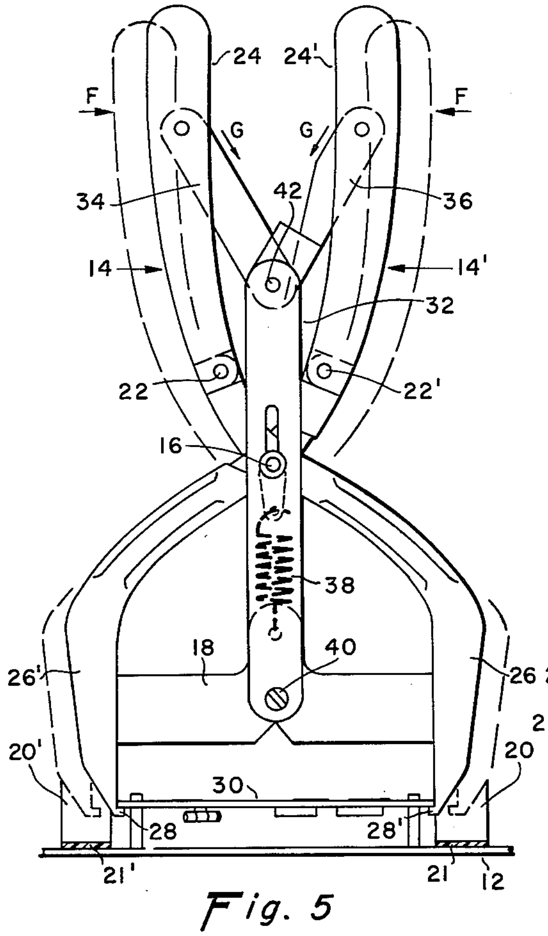
FIG. 5 is a diagrammatic representation of the tool of FIG. 1 at the completion of the clamping operation.

The following is a more detailed description of the operation of the device. A lateral force F on both handles 24, 24′ causes an opposite direction reaction P on corresponding jaws 26, 26′ due to the function of the dowel 16 as a fulcrum for the cross levers. As shown in FIG. 5, this reacting force brings the jaws into contact with the sides of the element card 30 with the lips 28, 28′ of the jaws underlying the edges of the card. Once a solid clamping contact is thus established, an increase in the force F would normally cause an increase of clamping pressure resulting in the jaws damaging the card. This is prevented, however, by the flexible knees 22, 22′ between the handles 24, 24′ and clamping portions 26, 26′ of the cross levers 14, 14′.

Figure 4:
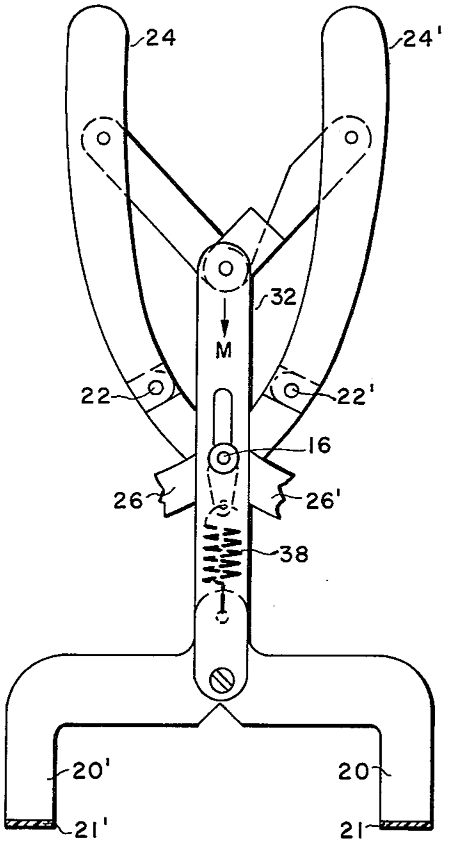
FIG. 4 is a diagrammatic representation of the section of the tool concerned with transmitting a downward force and resultant upward pull in the leverage system of the device.
Figure 6:
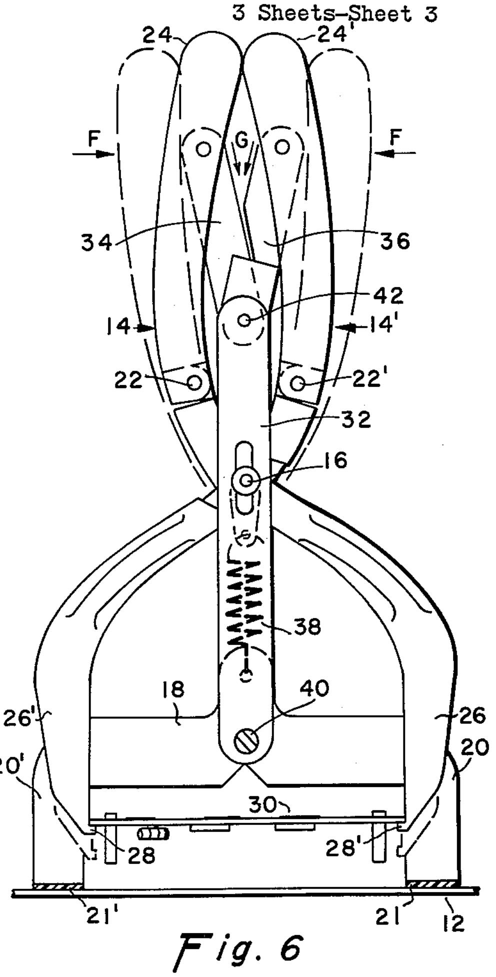
FIG. 6 is a similar representation of the tool after completion of the removal operation.

When the clamping jaws have become rigid in their grip of the sides of the element card, these knees 22, 22' bend in the direction of the arrows in FIGS. 4 and 5. This causes the reaction to the force F applied at the handles 24, 24' to be translated in greater proportion to the force G applied to the rocker arms 34, 36 and provides an increase in the downward thrust M exerted against the guidebar 32. This thrust, in turn, is transmitted to the feet 20, 20' of the pedestal portion 18 of the assembly which are braced against the supporting logic board 12. Since the board 12 restrains the pedestal from downward motion, a consequent command for relative motion results in a reacting force in the opposite direction to the arrows G and M and pushes the handles 24, 24' of the clamping assembly upward from the pedestal to the position shown in FIG. 6. This relative motion of the pedestal and clamping assemblies is made possible by the fulcrum 16 of the cross levers 14, 14' sliding in the slot 36 of the guidebar 32 against the force of the tension spring 38 connected between the fulcrum dowel 16 and the pedestal 18.

Once the relative separation of the pedestal assembly and the clamping assembly has resulted in removal of the element card 30 from the supporting logic board 12, the card is held securely between the clamping jaws by retaining hand pressure on the handles of the cross levers against the force of the tension spring. When desired, the card can be released from the lifter tool by simply releasing the clamping pressure from the handles.

Figure 7:
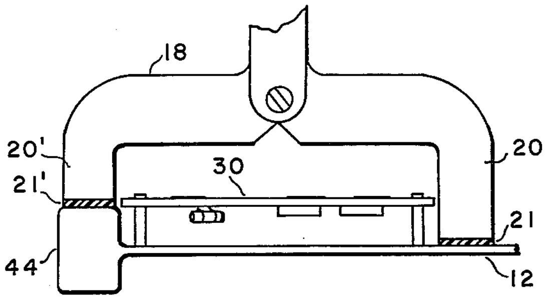
FIG. 7 is a representation of an uneven feet arrangement used for bracing against a raised border of a logic board.

As shown in the modification of FIG. 7, the lifter tool of the invention may be used with package assemblies where the element cards 30 are located in close proximity to a raised border 44 on a supporting board 12. For this purpose, one of the feet 20 (or 20') of the pedestal 18 may be made shorter than the other to accommodate the difference in height between the raised border and the surface of the board.

The invention has been described as employed in a specific tool for lifting a circuit element card from logic board structures. It is not, however, limited to the specific structure shown and described, but is to be accorded the full scope of the following claim.

What is claimed is:

For separating circuit element cards from supporting boards, a tool comprising: a pedestal member having a substantially horizontal crossbar portion and a substantially vertical guide bar portion; said crossbar portion having a supporting foot member depending from either end thereof, said feet being adapted to straddle and said crossbar being thereby adapted to bridge an element card to be separated; a vertical slot in said guide bar; a pivot pin reciprocably mounted in said slot; a pair of manipulating levers, each having a handle portion and a clamping portion, said portions being connected by a flexible joint; each of said clamping portions being pivotable upon said pivot pin as a fulcrum for its respective lever, and each being terminable in a bifurcation; said bifurcations each being adapted to straddle a corresponding one of said pedestal feet and each terminating in a card-engaging lip; a spring member holding said pin at one end of said slot; and, first and second rocker arms connected between the handle portions of one and the other, respectively, of said pair of levers and said guide bar; whereby, in response to lateral pressure on said handle portions, said tool is adapted to pivot said levers upon said reciprocably-mounted pin as a fulcrum until said clamping portions contact against opposite sides of an element card, whereupon said handle portions pivot at said flexible joints and, through said rocker arms, exert a thrust against said guide bar and the force of said spring, said pin moving in said slot to accommodate the resulting relative motion of said guide bar and said levers.

References Cited in the file of this patent

UNITED STATES PATENTS

| | | |
|---|---|---|
| 1,459,131 | Alexander | June 19, 1923 |
| 2,202,984 | Drypolcher | June 4, 1940 |
| 2,486,851 | Jennings et al. | Nov. 1, 1949 |